US010412326B2

(12) United States Patent
Geurts et al.

(10) Patent No.: US 10,412,326 B2
(45) Date of Patent: Sep. 10, 2019

(54) GLOBAL SHUTTER IMAGING PIXELS (71) Applicant: SEMICONDUCTOR COMPONENTS INDUSTRIES, LLC, Phoenix, AZ (US)

(72) Inventors: Tomas Geurts, Haasrode (BE); Thomas Cools, Schelle (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/182,746

(22) Filed: Nov. 7, 2018

(65) Prior Publication Data
US 2019/0075259 A1    Mar. 7, 2019

Related U.S. Application Data (62) Division of application No. 15/258,063, filed on Sep. 7, 2016, now Pat. No. 10,154,210.

(51) Int. Cl.
*H01L 27/146* (2006.01)
*H04N 5/3745* (2011.01)
*H04N 5/378* (2011.01)
*H04N 5/353* (2011.01)
(Continued)

(52) U.S. Cl.
CPC ....... *H04N 5/353* (2013.01); *H01L 27/14609* (2013.01); *H04N 5/3575* (2013.01); *H04N 5/378* (2013.01); *H04N 5/3742* (2013.01); *H04N 5/3745* (2013.01);
(Continued)

(58) Field of Classification Search
CPC ........ H01L 27/14609; H01L 27/14654; H04N 5/374; H04N 5/3745; H04N 5/37452; H04N 5/37457; H04N 5/3742; H04N 5/378; H04N 5/353; H04N 5/3575
See application file for complete search history.

(56) References Cited

U.S. PATENT DOCUMENTS 8,077,236 B2    12/2011    Johnson et al.
8,179,463 B1     5/2012    Geurts
8,710,419 B2     4/2014    Bogaerts
(Continued)

OTHER PUBLICATIONS

De Wit et al., "A Low Noise Low Power Global Shutter CMOS Pixel Having Single readout capability and Good Shutter Efficiency"; Proc. of IISW, 2011, pp. 312-315.

*Primary Examiner* — Ngoc Yen T Vu
(74) *Attorney, Agent, or Firm* — Treyz Law Group, P.C.; Joseph F. Guihan (57) ABSTRACT

A global shutter imaging pixel may have a single source follower transistor. The source follower transistor may be coupled to a floating diffusion region and a charge storage region. In order to read out samples from the charge storage region without including a second source follower transistor in each pixel, the samples may be transferred to floating diffusion regions of adjacent pixels. Alternatively, a transistor may be configured to transfer charge from the charge storage region to the floating diffusion region of the same pixel, thus reusing a single source follower transistor. These types of pixels may be used for correlated double sampling, where a reset charge level and integration charge level are both sampled. These pixels may also operate in a global shutter mode where images are captured simultaneously by each pixel.

20 Claims, 8 Drawing Sheets (51) Int. Cl.
*H04N 5/374* (2011.01)
*H04N 5/357* (2011.01)

(52) U.S. Cl.
CPC ..... *H04N 5/37452* (2013.01); *H04N 5/37457* (2013.01); *H01L 27/14654* (2013.01)

(56) References Cited

U.S. PATENT DOCUMENTS

| | | |
|---|---|---|
| 8,987,646 B2 | 3/2015 | De Witt et al. |
| 9,001,251 B2 * | 4/2015 | Smith ............... H01L 27/14641 348/302 |
| 9,338,381 B2 | 5/2016 | Kondo |
| 9,686,486 B2 | 6/2017 | Mauritzson et al. |
| 9,692,997 B2 * | 6/2017 | Hseih ..................... H04N 5/363 |
| 9,819,882 B2 * | 11/2017 | Dierickx ........... H01L 27/14609 |
| 9,888,200 B2 * | 2/2018 | Hsu ........................ H04N 5/378 |
| 2007/0040922 A1 * | 2/2007 | McKee ............. H01L 27/14609 348/308 |
| 2010/0181465 A1 | 7/2010 | Fossum |

\* cited by examiner

GLOBAL SHUTTER IMAGING PIXELS

This application is a division of U.S. patent application Ser. No. 15/258,063, filed Sep. 7, 2016, which is hereby incorporated by reference herein in its entirety. This application claims the benefit of and claims priority to U.S. patent application Ser. No. 15/258,063, filed Sep. 7, 2016.

BACKGROUND

This relates generally to imaging systems and, more particularly, to complementary metal-oxide semiconductor (CMOS) image sensors with global shutter functionality.

Modern electronic devices such as cellular telephones, cameras, and computers often use digital image sensors. Imager sensors (sometimes referred to as imagers) may be formed from a two-dimensional array of image sensing pixels. Each pixel includes a photosensitive layer that receives incident photons (light) and converts the photons into electrical signals. Image sensors are sometimes designed to provide images to electronic devices using a Joint Photographic Experts Group (JPEG) format.

Image sensors can operate using a global shutter or a rolling shutter scheme. In a global shutter, every pixel in the image sensor may simultaneously capture an image, whereas in a rolling shutter each row of pixels may sequentially capture an image. In order to implement a global shutter, image sensors may include one or more charge storage regions coupled to a floating diffusion region in each pixel. Two source follower transistors are sometimes used to implement global shutter functionality in conventional imaging pixels. However, including two source follower transistors in each imaging pixel may take up large amounts of pixel area.

It would therefore be desirable to provide improved global shutter pixels for image sensors.

DETAILED DESCRIPTION

Figure 1:
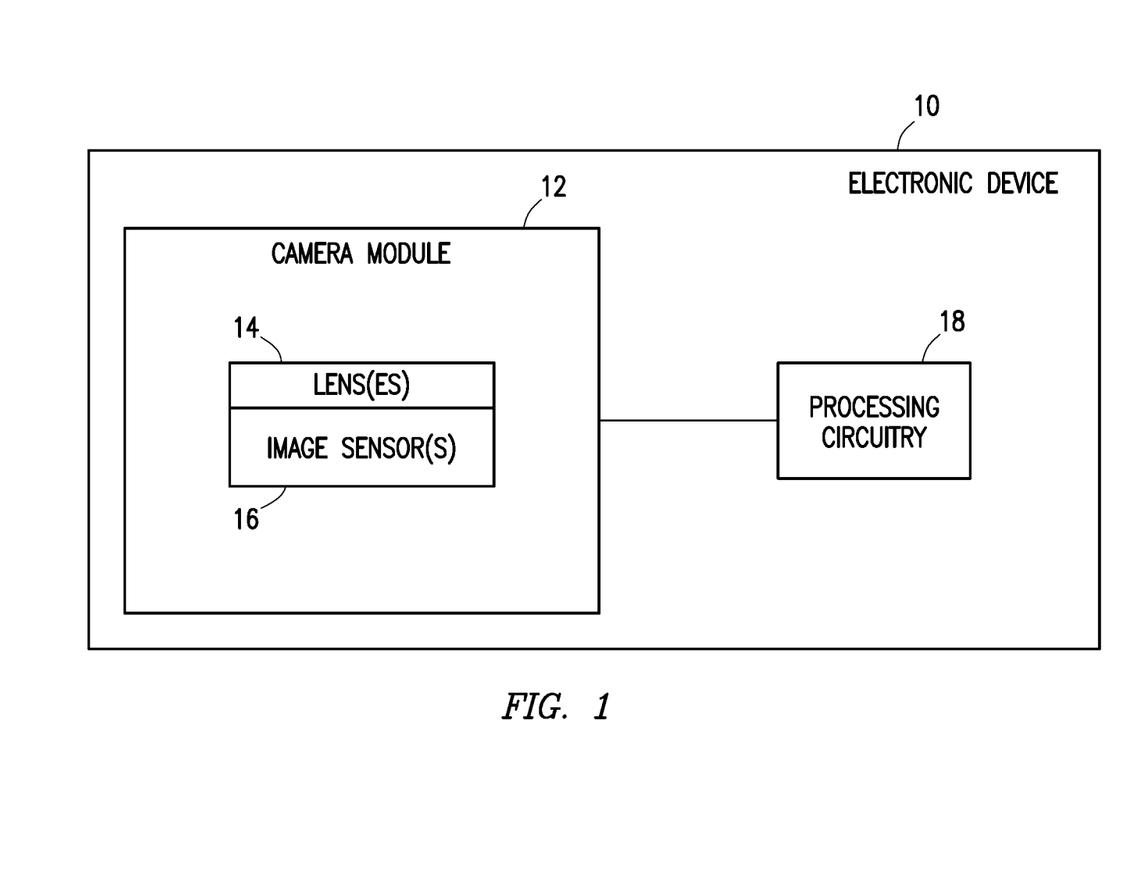
FIG. 1 is a schematic diagram of an illustrative electronic device that may include an image sensor in accordance with an embodiment of the present invention.

Embodiments of the present invention relate to image sensors with global shutter pixels. An illustrative electronic device that may include an image sensor with global shutter pixels is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SOC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Image sensor 16 and processing circuitry 18 may be implemented using a stacked-chip arrangement if desired. Processing circuitry 18 may include microprocessors, microcontrollers, digital signal processors, application specific integrated circuits, or other processing circuits.

Figure 2:
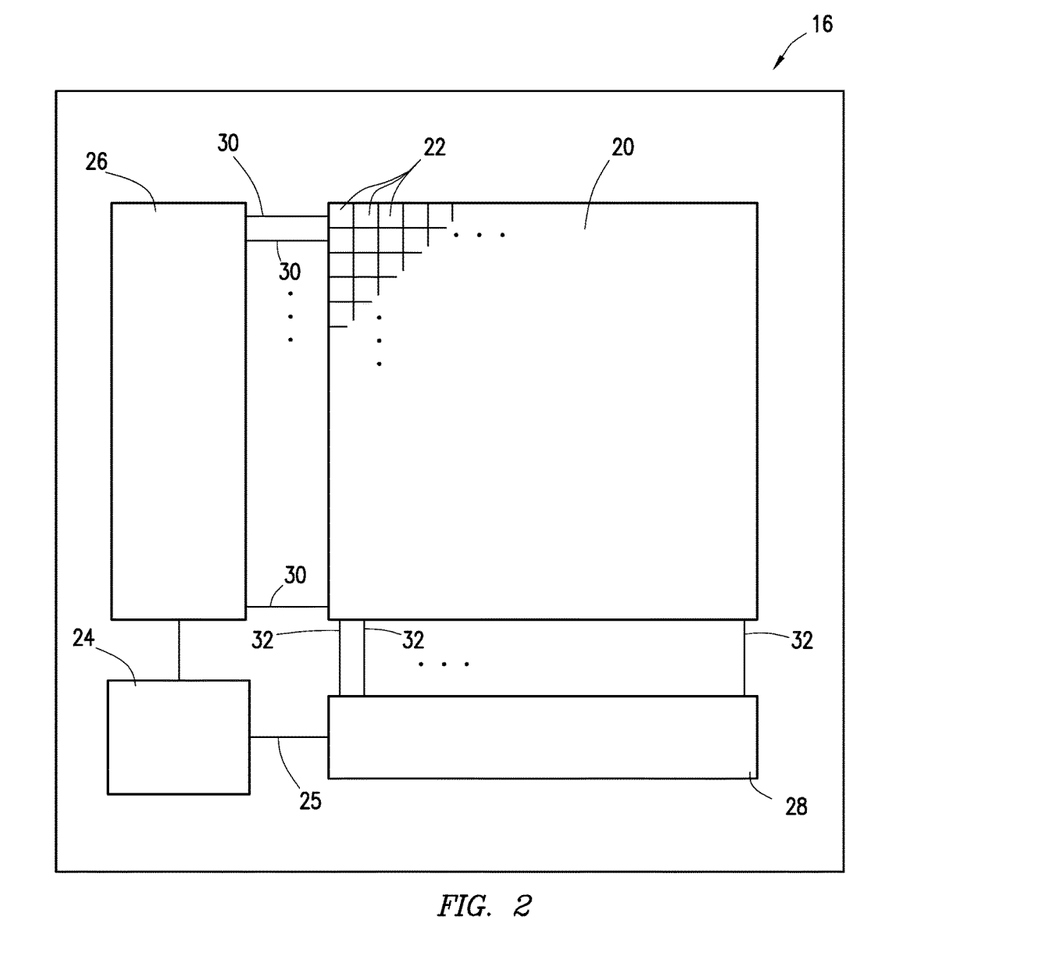
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry).

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Although FIG. 2 shows sensor 16 as having multiple rows and columns of pixels (i.e., a 2D sensor), sensor 16 may be a 1D sensor if desired. For example, sensor 16 may include a single column of pixels (sometimes referred to as a line sensor).

Figure 3:
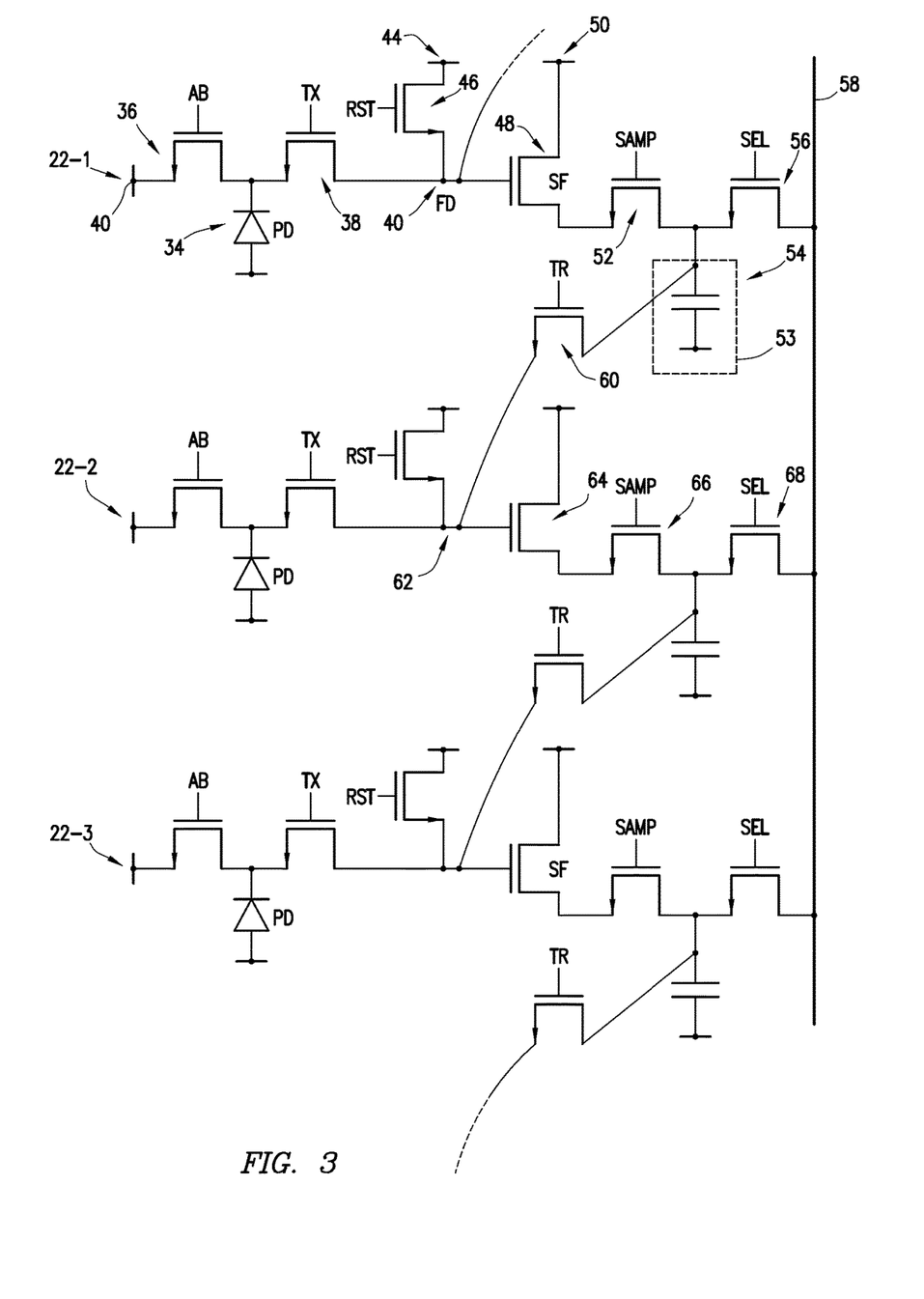
FIG. 3 is a diagram of illustrative global shutter imaging pixels that use source follower transistors from adjacent pixels in accordance with an embodiment of the present invention.

FIG. 3 shows pixel circuitry for illustrative global shutter image pixels 22. Three imaging pixels (22-1, 22-2, and 22-3) are depicted in FIG. 3. As shown, pixel 22-1 may include a photodiode 34. Incoming light may be collected by photodiode 34 (PD), and photodiode 34 may convert the light to electrical charge. Photodiode 34 may be an n-type or p-type doped semiconductor region, for example. N-type photodiodes may convert impinging photons into electrons, while p-type photodiodes may convert impinging photons into holes. Pixel 22 may also include components such as antiblooming transistor 36 (AB) and transfer transistor 38 (TX). Anti-blooming transistor 36 may be asserted to electrically connect photodiode 34 to bias voltage supply line 40. Asserting anti-blooming transistor 36 may clear photodiode 34 of excess charge before a charge integration period begins. After a charge integration period concludes, transfer transistor 38 may be asserted to transfer charge from photodiode 34 to floating diffusion region 42 (FD). Floating diffusion region 42 may be a doped semiconductor region (e.g., a region in a silicon substrate that is doped by ion implantation, impurity diffusion, or other doping processes), for example. Floating diffusion region 42 may be coupled to bias voltage supply line 44 by reset transistor 46. When reset transistor 46 is asserted, floating diffusion region 42 may be coupled to bias voltage supply line 44 and the charge level at floating diffusion region 42 will be reset to a baseline level.

Floating diffusion region 42 may be coupled to source follower transistor 48. Source follower transistor 48 may be coupled to bias voltage supply line 50 and sample transistor 52. When it is desired to sample the charge level on floating diffusion region 42, sample transistor 52 (SAMP) may be asserted. The charge may be transferred to charge storage region 53 when the sample transistor 52 is asserted. In some cases, the charge in charge storage region 53 may be transferred to column line 58 by asserting select transistor 56 (SEL). Alternatively, transfer transistor 60 (TR) may be asserted to transfer charge from charge storage region 53 to the floating diffusion region of pixel 22-2. The charge may then ultimately be sampled and read out using the pixel circuitry of pixel 22-2 (i.e., source follower 64 in pixel 22-2). Charge storage region 53 may be formed using any desired components. In FIG. 3, charge storage region 53 includes storage capacitor 54. However, this example is merely illustrative. If desired, charge storage region 53 may include one or more storage diodes, storage gates, storage capacitors, or any other desired components for storing charge.

Pixels 22-1, 22-2, and 22-3 may be positioned in the same column of pixel array 20. Each pixel may be formed in a different row of pixel array 20. For example, pixel 22-1 may be formed in a first row of pixel array 20, pixel 22-2 may be formed in a second row of pixel array 20, and pixel 22-3 may be formed in a third row of pixel array 20. The first, second, and third rows may be directly adjacent. The arrangement shown in FIG. 3 may enable each pixel to operate in a global shutter mode. The operation of the illustrative global shutter pixels is described in connection with FIG. 4.

Figure 4:
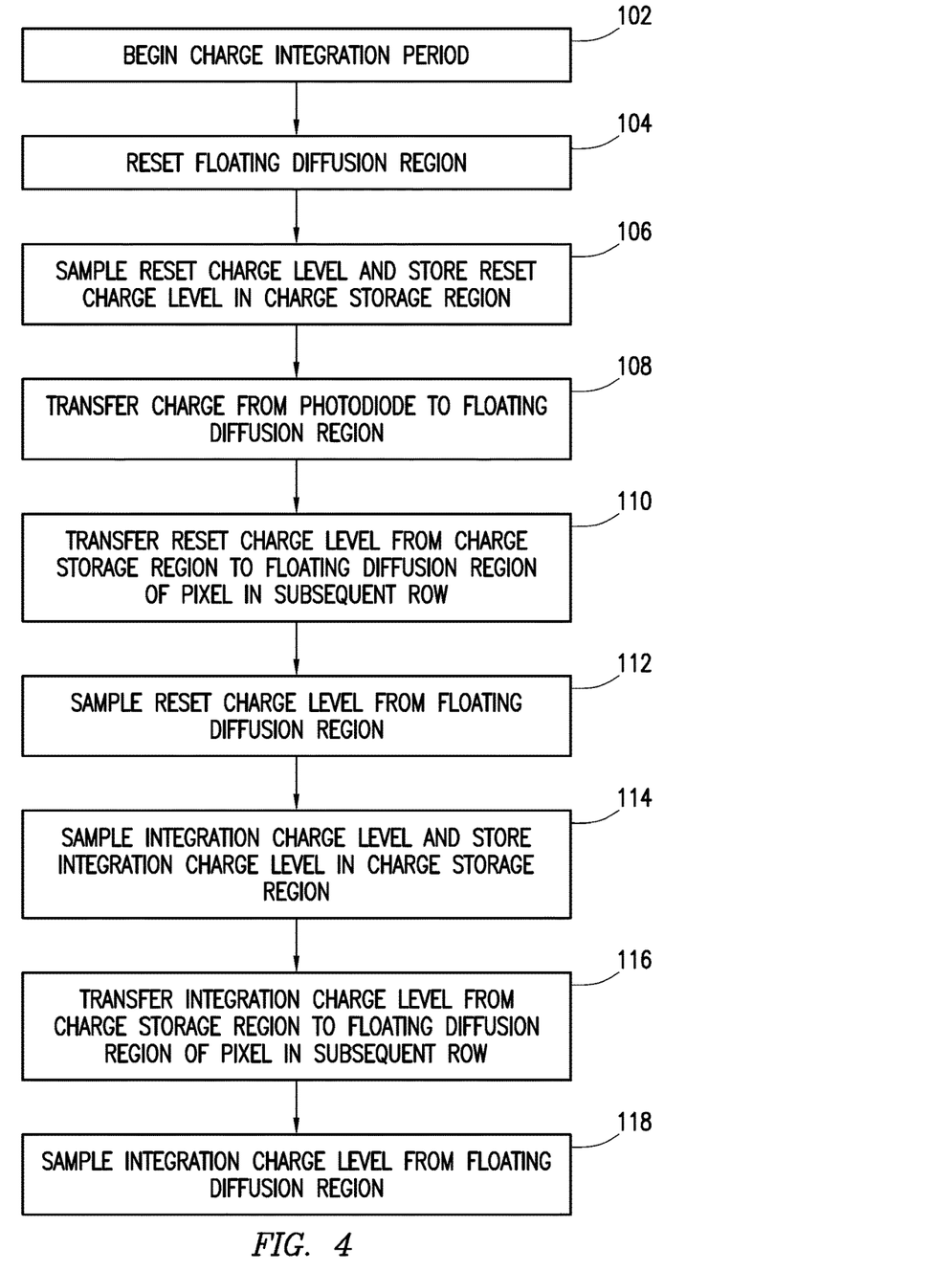
FIG. 4 is a diagram of illustrative steps for operating a global shutter imaging pixel of the type shown in FIG. 3 in accordance with an embodiment of the present invention.

As shown in FIG. 4, operation of the pixels shown in FIG. 3 may start by beginning a charge integration period at step 102. The charge integration period may begin by asserting anti-blooming transistor 36 to clear the photodiode of excess charge. After the anti-blooming gate is turned off, the photodiode may begin to accumulate charge, thus beginning the charge integration period. Next, before ending the charge integration period, the floating diffusion region 42 may be reset by asserting reset 46 at step 104. At step 106, the reset charge level may be sampled by asserting sample transistor 52. This may result in the reset charge level being stored in charge storage region 53. After sampling the reset charge level, the charge accumulated in the photodiode may be transferred to the floating diffusion region by asserting transfer transistor 38 at step 108. Transferring the charge from the photodiode ends the charge integration period and results in the integration charge level being stored on the floating diffusion region.

Steps 102, 104, 106, and 108 may be completed globally, meaning that each pixel in the array may complete these steps simultaneously. This way, the charge integration time of each pixel in the array will be the same and the image sensor will operate in a global shutter mode. Steps occurring after step 108 may be completed on a row-by-row basis instead of globally. After the conclusion of step 108, every pixel in the array may have a reset charge level stored in a respective charge storage region and an integration charge level stored in a respective floating diffusion region. Readout of the charge levels may proceed using a rolling scheme where each row sequentially reads out the charge levels. The readout may begin with the last row in the array and move up sequentially. The readout sequence for a given pixel (22-1) will be explained below as an illustrative example.

At step 110, the reset charge (which is stored in charge storage region 53) may be transferred to the floating diffusion region of the pixel in the subsequent row of the same column (i.e., floating diffusion region 62 of pixel 22-2). The reset charge in charge storage region 53 of pixel 22-1 may be transferred to floating diffusion region 62 of pixel 22-2 by asserting transfer transistor 60. Next, the reset charge level may be sampled from floating diffusion region 62 at step 112. The reset charge level may be sampled by asserting sample transistor 66 (SAMP) and select transistor 68 (SEL) of pixel 22-2. After step 112 is complete, the integration charge level may be transferred from floating diffusion region 42 to charge storage region 53 at step 114. The integration charge level may be transferred to charge storage region 53 by asserting sample transistor 52. At step 116, the integration charge level may then be transferred from charge storage region 53 to floating diffusion region 62 by asserting transfer transistor 60. Finally, at step 118 the integration charge level may sampled from floating diffusion region 62 by asserting sample transistor 66 and select transistor 68. After step 118, floating diffusion region 42 may be reset by asserting reset transistor 46.

The pixel structure shown in FIG. 3 and described in connection with FIG. 4 enables a global shutter image sensor where each pixel has only one source follower transistor. This is made possible by each pixel using a source follower transistor from another pixel during operation (i.e., pixel 22-1 uses the floating diffusion region and source follower transistor of pixel 22-2, pixel 22-2 uses the floating diffusion region and source follower transistor of pixel 22-3, etc.). In order for this to be possible, the pixels in the last row of the image sensor need a pixel from which to "borrow" a source-follower transistor. Accordingly, the image sensor may be provided with a dummy row of pixels after the last row in the array. The last row of pixels may use the source follower transistors from the dummy row of pixels to readout the data from the last row of pixels. After the data from the last row of pixels has been read out, the second to last row of pixels may use the source follower transistors from the last row of pixels to read out the data from the second to last row of pixels. This pattern may continue until all of the data has been read from the array.

In this example, the last row in the array refers to the row physically positioned at the very bottom of the pixel array. However, the last row in the array may actually be scanned first. It can be understood that if desired the dummy row of pixels may be physically positioned at the very top of the pixel array and the first row of pixels (i.e., the row at the top of the array adjacent to the dummy pixels) may be scanned first.

As described in connection with FIGS. 3 and 4 above, the structure of the pixels 22 in FIG. 3 may enable both the reset charge level and integration charge level to be sampled for a given integration time. This sampling technique may sometimes be referred to as correlated double sampling (CDS). Correlated double sampling is used to correct for noise in imaging pixels. As previously discussed, voltage at the floating diffusion region may be sampled to determine the amount of incident light exposure for an imaging pixel. Ideally, all of the voltage at the floating diffusion region would be associated with the incident light. However, in reality this is not the case and some of the voltage will be present due to noise. In order to isolate the voltage that comes from the incident light, correlated double sampling compares the reset voltage level at the FD to the integration voltage level at the FD. The reset voltage level is the amount of voltage that comes from noise, while the integration voltage level includes voltage from noise and incident light. The reset voltage level may be subtracted from the integration voltage level to isolate the amount of voltage associated with the incident light.

Figure 5:
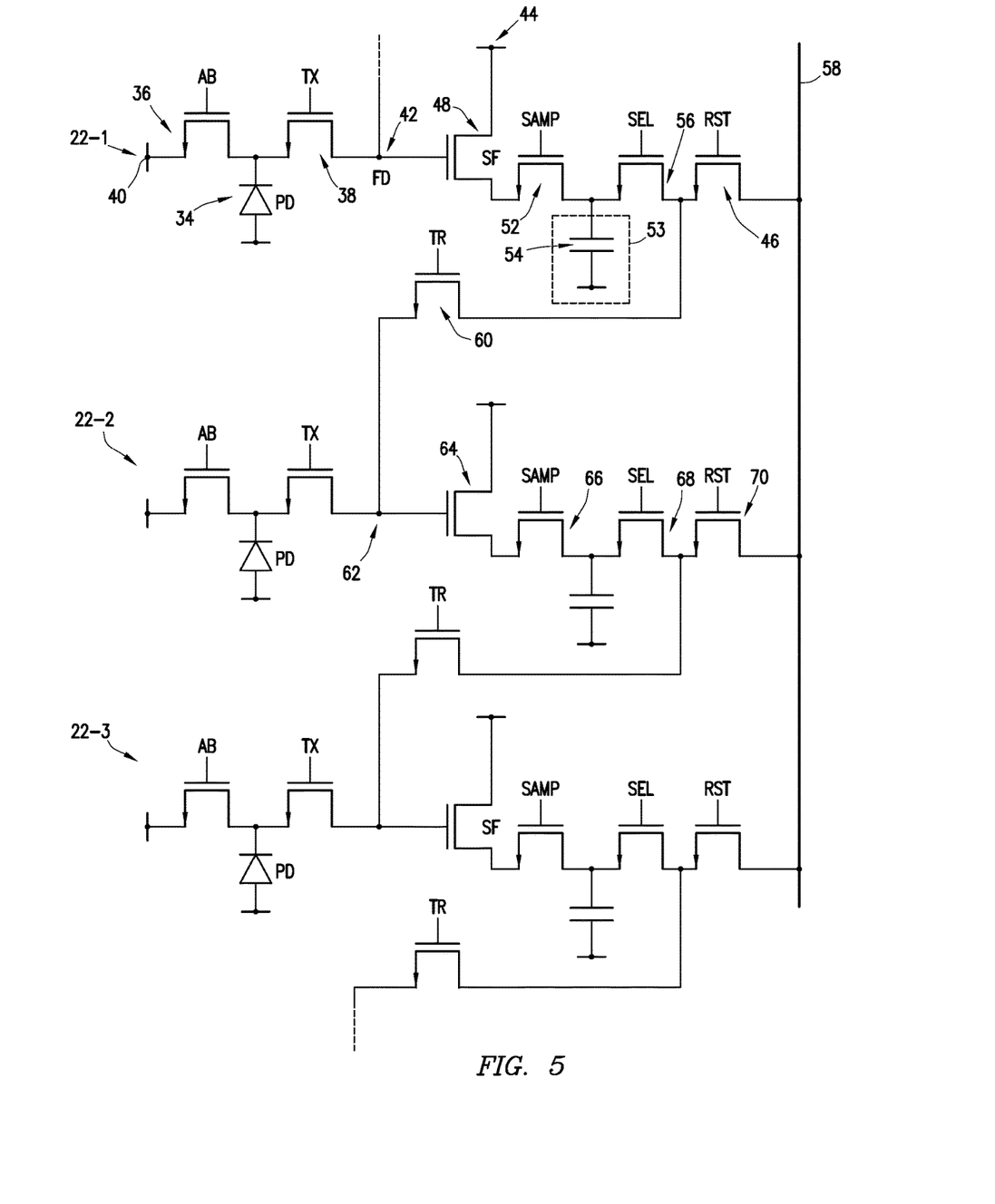
FIG. 5 is a diagram of illustrative shutter imaging pixels that use source follower transistors from adjacent pixels in accordance with an embodiment of the present invention.

The pixel circuitry shown in FIG. 3 is merely illustrative of the concept of using source follower transistors from other pixels for global shutter operation. Numerous modifications may be made to the pixel circuitry while still using this concept. An alternate embodiment is shown in FIG. 5. The structure of the pixels in FIG. 5 is similar to the structure of the pixels in FIG. 3. However, in FIG. 3 reset transistor 46 was coupled directly to floating diffusion region 42. In contrast, in FIG. 5 reset transistor 46 is coupled between column line 58, select transistor 56, and transfer transistor 60. Reset transistor 46 in pixel 22-1 may be used to reset floating diffusion region 62 in pixel 22-2. When transfer transistor 60 and reset transistor 46 are asserted and a bias voltage is supplied to column line 58, floating diffusion region 62 may be reset to the bias voltage level. Similarly, in order to read out a sample from floating diffusion region 42, sample transistor 52, select transistor 56, and reset transistor 46 may all be asserted. In order to transfer charge from charge storage region 53 to floating diffusion region 62, select transistor 56 and transfer transistor 60 may be asserted while reset transistor 46 remains off.

Operation of the pixels in FIG. 5 may follow the steps described in FIG. 4. However, at step 104, the floating diffusion region may be reset by asserting the transfer transistor and reset transistor as previously described (instead of just the reset transistor). At step 110, the reset charge level may be transferred from charge storage region 53 to floating diffusion region 62 by asserting select transistor 56 and transfer transistor 60. At step 112, sample transistor 66, select transistor 68, and reset transistor 70 may be asserted to sample the reset charge level from floating diffusion region 62. At step 116, select transistor 56 and transfer transistor 60 may be asserted to transfer the integration charge level from charge storage region 53 to floating diffusion region 62. At step 118, sample transistor 66, select transistor 68, and reset transistor 70 may be asserted to sample the integration charge level from floating diffusion region 62. After step 118, the floating diffusion region 42 may be reset by asserting the transfer transistor and reset transistor of an adjacent pixel.

FIGS. 3-5 relate to embodiments where pixels use source follower transistors from other pixels to enable each pixel to have only one source follower transistor and still operate in a global shutter mode. In the examples of FIGS. 3-5, each pixel uses a source follower transistor from a neighboring pixel in the same column. However, this example is merely illustrative. If desired, this concept may be applied to non-adjacent pixels. For example, a pixel may use a source follower transistor from a pixel in the same column but a non-adjacent row. Additionally, a pixel may use a source follower transistor from a pixel in a different column. In one example, a pixel may use a source follower transistor from a diagonal neighbor. In general, a pixel may use a source follower transistor from any other pixel in the array.

In other embodiments a pixel may have a single source follower transistor and operate in a global shutter mode by reusing the source follower transistor. An arrangement of this type is shown in FIG. 6.

Figure 6:
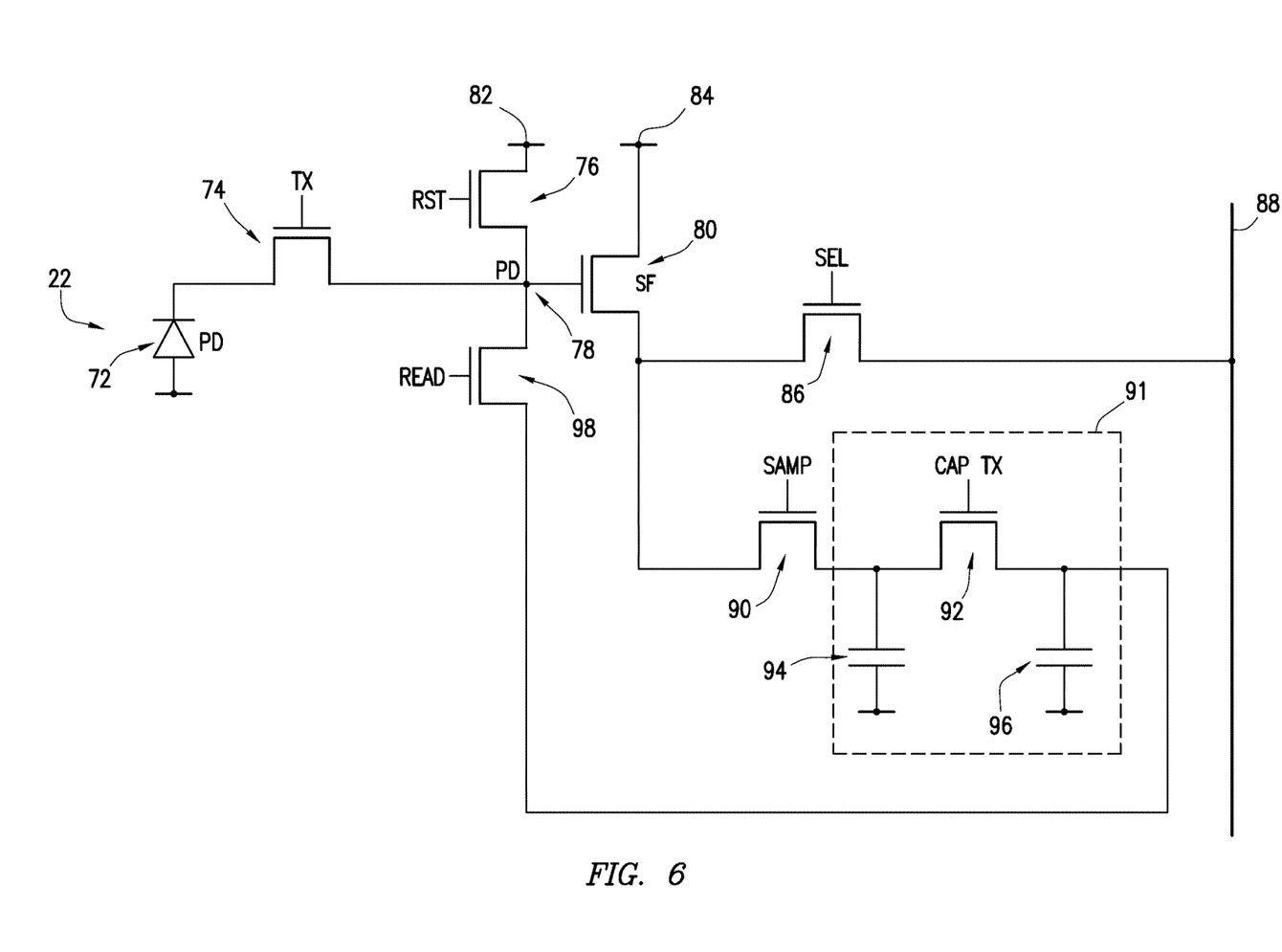
FIG. 6 is a diagram of an illustrative global shutter imaging pixel that reuses a source follower transistor in accordance with an embodiment of the present invention.

As shown in FIG. 6, pixel 22 may include a photodiode 72. Incoming light may be collected by photodiode 72 (PD), and photodiode 72 may convert the light to electrical charge. Photodiode 72 may be an n-type or p-type doped semiconductor region, for example. Pixel 22 may also include components such as transfer transistor 74 (TX). After a charge integration period concludes, transfer transistor 74 may be asserted to transfer charge from photodiode 72 to floating diffusion region 78 (FD). Floating diffusion region 78 may be a doped semiconductor region (e.g., a region in a silicon substrate that is doped by ion implantation, impurity diffusion, or other doping processes), for example. Floating diffusion region 78 may be coupled to bias voltage supply line 82 by reset transistor 76. When reset transistor 76 is asserted, floating diffusion region 78 may be coupled to bias voltage supply line 82 and the charge level at floating diffusion region 78 will be reset to a baseline level.

Floating diffusion region 78 may be coupled to source follower transistor 80. Source follower transistor 80 may be coupled to bias voltage supply line 84. Source follower transistor 80 may also be coupled to sample transistor 90 and select transistor 86. When it is desired to sample the charge level on floating diffusion region 78, sample transistor 90 (SAMP) or select transistor 86 (SEL) may be asserted. If select transistor 86 is asserted, the charge level on floating diffusion region 78 may be sampled and read out by column line 88. If sample transistor 90 is asserted, the charge level on floating diffusion region 78 may be transferred to charge storage region 91. Charge storage region 91 may be capable of independently storing at least two different charge levels.

Any desired components may be used in charge storage region 91. In the example of FIG. 6, first and second storage capacitors are included in charge storage region 91. A transfer transistor 92 is coupled between storage capacitor 94 and storage capacitor 96. An additional transistor 98 is coupled between charge storage region 91 and floating diffusion region 78.

During operation of pixel 22 in FIG. 6, photodiode 72 may accumulate charge during an integration period. Before the conclusion of the integration period, floating diffusion region 78 may be reset by asserting reset transistor 76. The reset charge level may then be sampled and stored in storage capacitor 96 by asserting sample transistor 90 and transfer transistor 92. Next, transfer transistor 74 may be asserted to transfer charge from photodiode 72 to floating diffusion region 78 and conclude the charge integration period. The integration charge level may then be sampled and stored in storage capacitor 94 by asserting sample transistor 90. Next, the charge levels may be read out sequentially. First, transistor 98 and select transistor 86 may be asserted to read out the reset charge level from storage capacitor 96. Next, transfer transistor 92, transistor 98, and select transistor 86 may be asserted to read out the integration charge level from storage capacitor 94.

Figure 7:
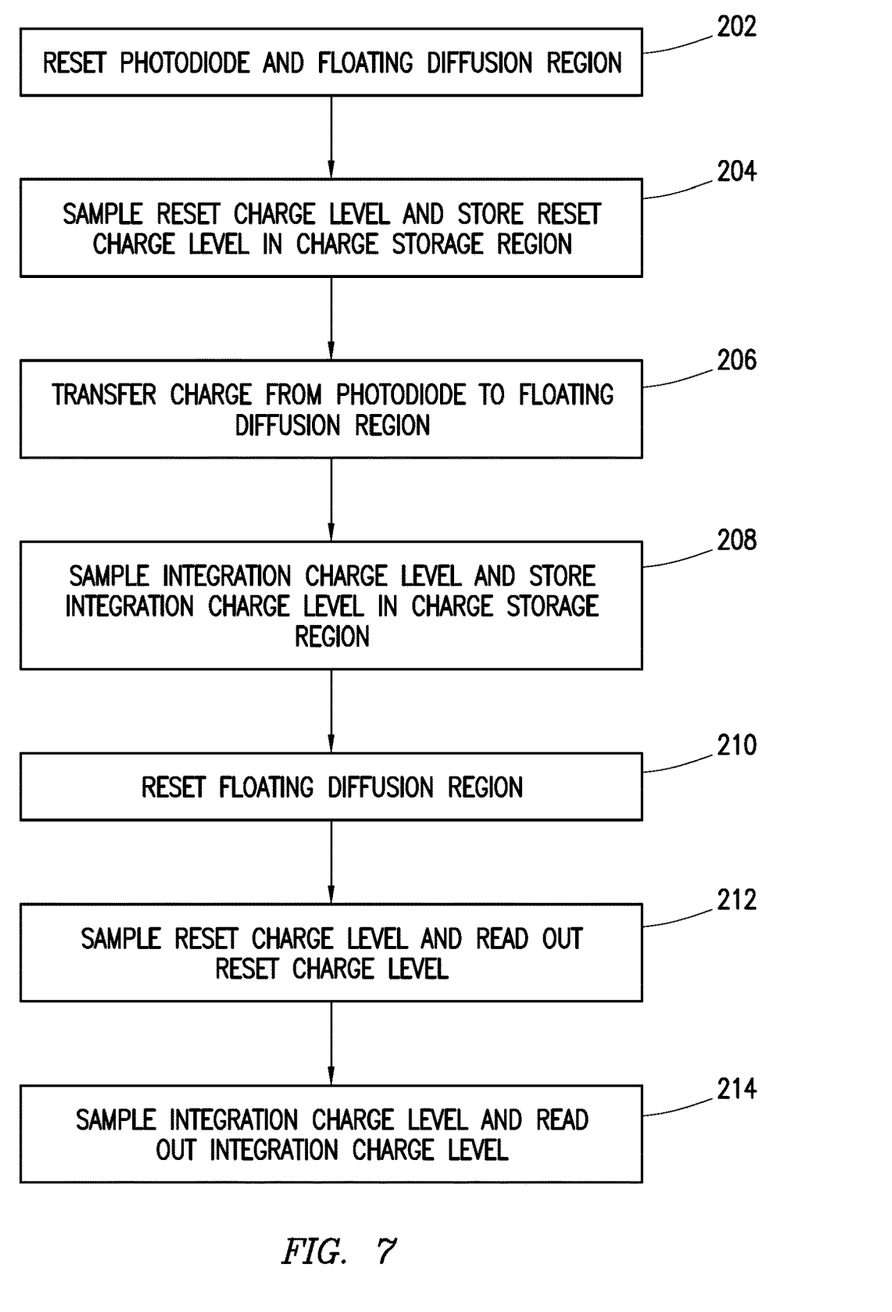
FIG. 7 is a diagram of illustrative steps for operating a global shutter imaging pixel of the type shown in FIG. 6 in accordance with an embodiment of the present invention.

A flowchart showing illustrative steps for operating pixel 22 in FIG. 6 is shown in FIG. 7. At step 202, photodiode 72 and floating diffusion region 78 may be reset by asserting transfer transistor 74 and reset transistor 76. It should be noted that if desired pixel 22 may include an anti-blooming transistor similar to those shown in FIGS. 3 and 5. At step 204, the reset charge level may be sampled and stored in charge storage region 91. To sample the reset charge level, sample transistor 90 and transfer transistor 92 may be asserted to store the reset charge level in capacitor 96. At step 206, accumulated charge from photodiode 72 may be transferred to floating diffusion 78 by asserting transistor 74. This integration charge level may then be sampled and stored in the charge storage region at step 208. To sample the integration charge level, sample transistor 90 may be asserted to store the integration charge level in storage capacitor 94. At step 210, floating diffusion region 78 may be reset by asserting reset transistor 76. Next, the reset charge level may be sampled and read out at step 212. First, read transistor 98 may be asserted to transfer the reset charge level from capacitor 96 to floating diffusion region 78. Then, select transistor 86 may be asserted to read out the reset charge level on column line 88. At step 214, the integration charge level may be sampled and read out. First, read transistor 98 and transfer transistor 92 may be asserted to transfer the integration charge level from capacitor 94 to floating diffusion region 78. Then, select transistor 86 may be asserted to read out the integration charge level on column line 88.

In FIG. 6, charge storage region 91 is depicted as including two storage capacitors. However, this example is merely illustrative and charge storage region 91 may include any desired components in any desired arrangement. If desired, charge storage region 91 may include one or more storage diodes, storage gates, storage capacitors, or any other desired components for storing charge.

Figure 8:
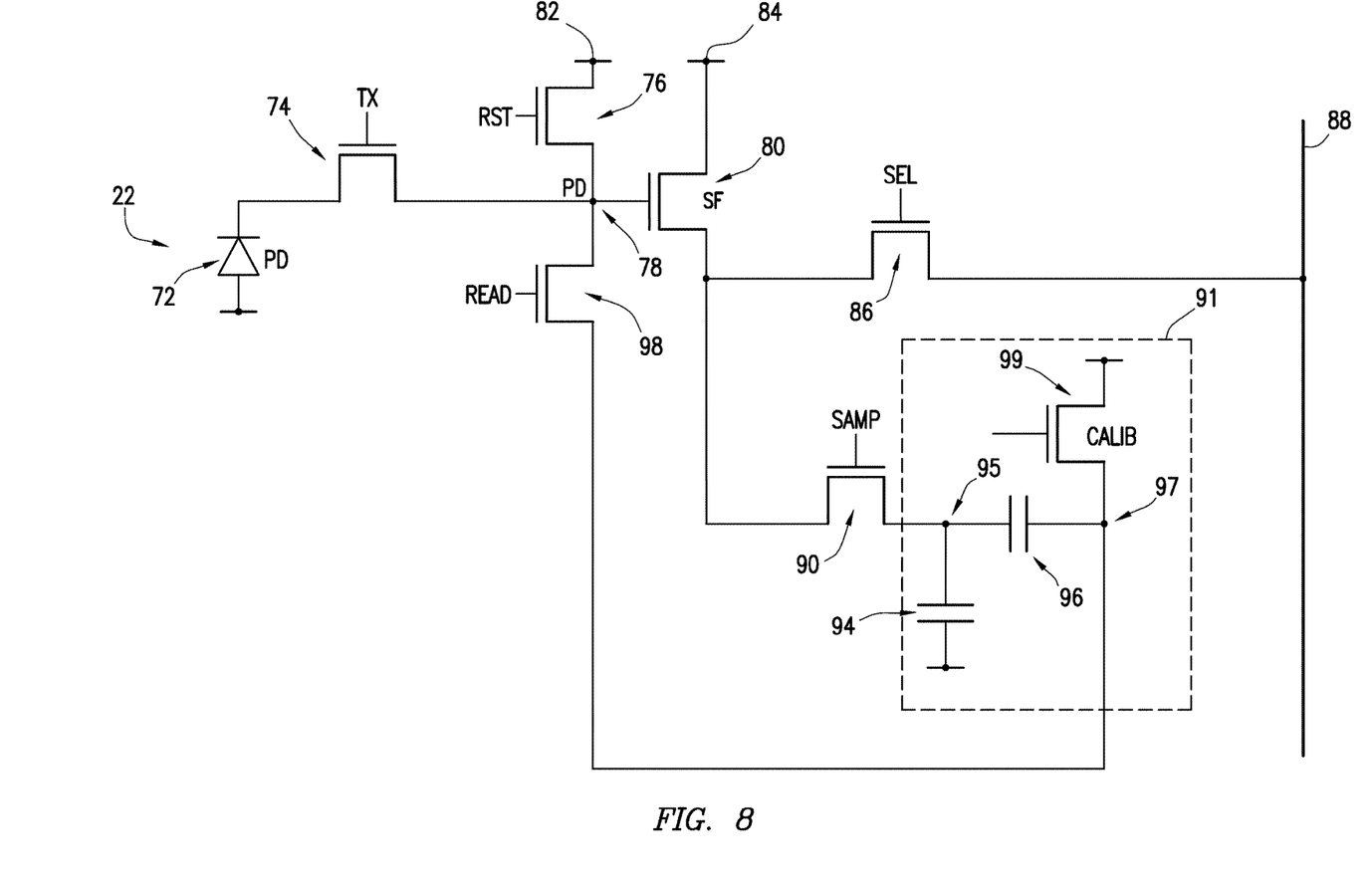
FIG. 8 is a diagram of an illustrative global shutter imaging pixel that reuses a source follower transistor in accordance with an embodiment of the present invention.

FIG. 8 shows an illustrative global shutter imaging pixel with a single source follower transistor. Pixel 22 in FIG. 8 has a similar structure to pixel 22 in FIG. 6. However, FIG. 8 has an alternate arrangement for charge storage region 91. Pixel 22 in FIG. 8 may include two charge storage capacitors 94 and 96. Both charge storage capacitors may be coupled to node 95. Charge storage capacitor 96 may also be coupled to node 97. Node 97 may be coupled to read transistor 98 and calibration transistor 99 (CALIB). Calibration transistor 99 may be coupled to bias voltage supply line 93. When transistor 99 is asserted, a bias voltage may be applied to node 97. Charge storage capacitors 94 and 96 may be used in combination with calibration transistor 99, sample transistor 90, and read transistor 98 to store and sample the reset charge level and integration charge level.

The storage and sampling schemes shown in FIGS. 3, 5, 6 and 8 are merely illustrative, and any desired circuitry may be used to store and sample charge in the pixels. Additionally, the pixels shown in FIGS. 3, 5, 6, and 8 may be implemented in a stacked-chip arrangement if desired. The pixel may be split at any desired point within the pixel (e.g., between the transfer transistor and the floating diffusion region, between the source follower transistor and the sample transistor, etc.).

In various embodiments of the present invention, a global shutter imaging pixel may include a photodiode, a floating diffusion region, a transfer transistor configured to transfer charge from the photodiode to the floating diffusion region, a source follower transistor coupled to the floating diffusion region, a charge storage region coupled to the source follower transistor, and a first transistor. The first transistor may be configured to transfer charge from the charge storage region to the floating diffusion region.

The global shutter imaging pixel may also include a second transistor that is coupled between the source follower transistor and the charge storage region. The global shutter imaging pixel may also include a third transistor that is coupled between the source follower transistor and a column line. The global shutter imaging pixel may also include a reset transistor that is coupled between the floating diffusion region and a bias voltage supply line. The charge storage region may include first and second storage capacitors and a fourth transistor that is coupled between the first and second storage capacitors. The charge storage region may include first and second storage capacitors that are coupled to a first node, the first node may be coupled to the second transistor, the second storage capacitor may be coupled between the first node and a second node, the second node may be coupled to the first transistor and a calibration transistor, and the calibration transistor may couple the second node to an additional bias voltage supply line. The charge storage region may include at least one component selected from the group consisting of: a storage capacitor, a storage diode, and a storage gate.

In various embodiments, an image sensor may include an array of imaging pixels. Each imaging pixel in the array of imaging pixels may include a photodiode, a floating diffusion region coupled the photodiode, a source follower transistor coupled to the floating diffusion region, a charge storage region coupled to the source follower transistor, and a first transistor that is configured to transfer charge from the charge storage region of the imaging pixel to the floating diffusion region of an adjacent imaging pixel.

Each imaging pixel may include a second transistor that is coupled between the source follower transistor and the charge storage region. Each imaging pixel may include a third transistor that is coupled between the photodiode and the floating diffusion region and a fourth transistor that is coupled between the floating diffusion region and a bias voltage supply line. Each imaging pixel may include a fifth transistor that is coupled between the charge storage region and a column line. Each imaging pixel may include a sixth transistor that is coupled between the photodiode and an additional bias voltage supply line.

Each imaging pixel may include a third transistor that is coupled between the photodiode and the floating diffusion region and a fourth transistor that is coupled between the charge storage region and the first transistor. Each imaging pixel may include a fifth transistor that is coupled between the fourth transistor and a column line. The first transistor of each imaging pixel may be configured to transfer charge from the charge storage region of the imaging pixel to the floating diffusion region of an adjacent imaging pixel that is in the same column of the array as the imaging pixel. The charge storage region of each imaging pixel may include a component selected from the group consisting of: a storage capacitor, a storage diode, and a storage gate.

In various embodiments, a method of operating a global shutter imaging pixel that includes a photodiode, a floating diffusion region, a source follower transistor, and a charge storage region may include generating charge in response to incident light with the photodiode, transferring the charge from the photodiode to the floating diffusion region so that the floating diffusion region has an integration charge level, sampling the integration charge level using the source follower transistor and storing the integration charge level in the charge storage region, transferring the integration charge level from the charge storage region to the floating diffusion region, and reading out the integration charge level from the floating diffusion region.

The method may also include resetting the floating diffusion region to a reset charge level by asserting a reset transistor before transferring the charge from the photodiode to the floating diffusion region, sampling the reset charge level using the source follower transistor and storing the reset charge level in the charge storage region after resetting the floating diffusion region to the reset charge level, transferring the reset charge level from the charge storage region to the floating diffusion region before transferring the integration charge level from the charge storage region to the floating diffusion region, and reading out the reset charge level from the floating diffusion region after transferring the reset charge level from the charge storage region to the floating diffusion region. Sampling the integration charge level may include asserting a transistor that is interposed between the source follower transistor and the charge storage region. Transferring the integration charge level from the charge storage region to the floating diffusion region may include asserting an additional transistor that is interposed between the charge storage region and the floating diffusion region.

The foregoing is merely illustrative of the principles of this invention and various modifications can be made by those skilled in the art. The foregoing embodiments may be implemented individually or in any combination.

What is claimed is:

1. An image sensor comprising an array of imaging pixels, wherein each imaging pixel in the array of imaging pixels comprises:
    a photodiode;
    a floating diffusion region coupled the photodiode;
    a source follower transistor coupled to the floating diffusion region;
    a charge storage region coupled to the source follower transistor; and
    a first transistor, wherein the first transistor is configured to transfer charge from the charge storage region of the imaging pixel to the floating diffusion region of an adjacent imaging pixel.

2. The image sensor defined in claim 1, wherein each imaging pixel in the array of imaging pixels further comprises:
    a second transistor, wherein the second transistor is coupled between the source follower transistor and the charge storage region.

3. The image sensor defined in claim 2, wherein each imaging pixel in the array of imaging pixels further comprises:
    a third transistor, wherein the third transistor is coupled between the photodiode and the floating diffusion region.

4. The image sensor defined in claim 3, wherein each imaging pixel in the array of imaging pixels further comprises:
    a fourth transistor, wherein the fourth transistor is coupled between the floating diffusion region and a bias voltage supply line.

5. The image sensor defined in claim 4, wherein each imaging pixel in the array of imaging pixels further comprises:
    a fifth transistor, wherein the fifth transistor is coupled between the charge storage region and a column line.

6. The image sensor defined in claim 5, wherein each imaging pixel in the array of imaging pixels further comprises:
    a sixth transistor, wherein the sixth transistor is coupled between the photodiode and an additional bias voltage supply line.

7. The image sensor defined in claim 3, wherein each imaging pixel in the array of imaging pixels further comprises:
    a fourth transistor, wherein the fourth transistor is coupled between the charge storage region and the first transistor.

8. The image sensor defined in claim 7, wherein each imaging pixel in the array of imaging pixels further comprises:
    a fifth transistor, wherein the fifth transistor is coupled between the fourth transistor and a column line.

9. The image sensor defined in claim 8, wherein each imaging pixel in the array of imaging pixels further comprises:
    a sixth transistor, wherein the sixth transistor is coupled between the photodiode and a bias voltage supply line.

10. The image sensor defined in claim 1, wherein the first transistor of each imaging pixel is configured to transfer charge from the charge storage region of the imaging pixel to the floating diffusion region of an adjacent imaging pixel that is in the same column of the array as the imaging pixel.

11. The image sensor defined in claim 1, wherein the charge storage region of each imaging pixel comprises a component selected from the group consisting of: a storage capacitor, a storage diode, and a storage gate.

12. An image sensor comprising:
    a first imaging pixel with a first photosensitive area and a first floating diffusion region;
    a second imaging pixel with a second photosensitive region, a second floating diffusion region, a source follower transistor, a charge storage region coupled to the source follower transistor, and at least one transistor configured to transfer charge from the charge storage region to the first floating diffusion region; and
    a third imaging pixel with a third photosensitive region, a third floating diffusion region, an additional source follower transistor, an additional charge storage region coupled to the additional source follower transistor, and at least one transistor configured to transfer charge from the additional charge storage region to the second floating diffusion region.

13. The image sensor defined in claim 12, wherein the first, second, and third imaging pixels are formed in a single column of imaging pixels.

14. The image sensor defined in claim 13, wherein the second imaging pixel is interposed between the first and third imaging pixels in the single column of imaging pixels.

15. The image sensor defined in claim 12, wherein the second imaging pixel comprises a reset transistor that is coupled between the second floating diffusion region and a bias voltage supply line.

16. The image sensor defined in claim 12, wherein the at least one transistor of the second imaging pixel comprises first and second transistors interposed between the charge storage region and the first floating diffusion region, wherein there is a node between the first and second transistors, and wherein the second imaging pixel comprises a reset transistor that is coupled between the node and a column line.

17. An image sensor comprising an array of imaging pixels, wherein each imaging pixel in the array of imaging pixels comprises:
  a photosensitive region;
  a floating diffusion region coupled the photosensitive region;
  a transfer transistor configured to transfer charge from the photosensitive region to the floating diffusion region;
  a source follower transistor, wherein the floating diffusion region is coupled to a gate of the source follower transistor;
  a storage capacitor coupled to the source follower transistor;
  a first transistor coupled between the source follower transistor and the storage capacitor; and
  at least one transistor that is coupled between the storage capacitor of the respective imaging pixel and the floating diffusion region of an adjacent imaging pixel.

18. The image sensor defined in claim 17, wherein each imaging pixel further comprises:
  a reset transistor coupled between the floating diffusion region and a bias voltage supply line.

19. The image sensor defined in claim 17, wherein each imaging pixel further comprises:
  a reset transistor coupled between a transistor of the at least one transistor and a column line.

20. The image sensor defined in claim 17, wherein the at least one transistor of each imaging pixel is coupled between the storage capacitor of the respective imaging pixel and the floating diffusion region of an adjacent imaging pixel in the same column of imaging pixels as the respective imaging pixel.

* * * * *